United States Patent [19]

Sperzel et al.

[11] Patent Number: 4,525,652
[45] Date of Patent: Jun. 25, 1985

[54] AUXILIARY-VOLTAGE SOURCE FOR SUPPLYING ELECTRIC CIRCUITS WHICH ARE AT A HIGH POTENTIAL

[75] Inventors: Wolfgang Sperzel, Gelnhausen-Hailer; Johann Stürmer, Freigericht, both of Fed. Rep. of Germany

[73] Assignee: Leybold-Heraeus GmbH, Cologne, Fed. Rep. of Germany

[21] Appl. No.: 544,402

[22] Filed: Oct. 21, 1983

[30] Foreign Application Priority Data

Oct. 23, 1982 [DE] Fed. Rep. of Germany ....... 3239337
Aug. 26, 1983 [DE] Fed. Rep. of Germany ....... 3330728

[51] Int. Cl.³ ............................................. H05B 37/02
[52] U.S. Cl. ........................................ 315/307; 315/1;
315/291; 315/106; 315/107; 250/310;
250/492.3; 378/16; 378/112; 378/113
[58] Field of Search ................. 315/1, 291, 310, 106,
315/107, 307, 354; 250/310, 492.3; 378/16, 108,
109, 111, 112, 113

[56] References Cited

U.S. PATENT DOCUMENTS

| | | | |
|---|---|---|---|
| 3,766,391 | 10/1973 | Siedband et al. | 378/112 |
| 3,825,839 | 7/1974 | Someya et al. | 315/310 |
| 3,838,313 | 9/1974 | Anderson | 250/492.3 |
| 4,007,375 | 2/1977 | Albert | 378/113 |
| 4,253,048 | 2/1981 | Osako | 315/307 |

OTHER PUBLICATIONS

"Electron Gun Beam Current Control . . ." by C. Kulka, J. Vacuum Soc. Tech., vol. 17, No. 3, May/Jun. 1980, pp. 688-690.

*Primary Examiner*—Harold Dixon
*Attorney, Agent, or Firm*—Felfe & Lynch

[57] ABSTRACT

In an auxiliary-voltage DC source for supplying an electric circuit and, more particularly, one at a high potential in an electron gun without an isolation transformer, the primary winding of a current transformer is located in an alternating-current section of the electric circuit. The current transformer has at least one secondary winding which is connected through a rectifier to a parallel regulator for providing the auxiliary-voltage.

14 Claims, 3 Drawing Figures

AUXILIARY-VOLTAGE SOURCE FOR SUPPLYING ELECTRIC CIRCUITS WHICH ARE AT A HIGH POTENTIAL

BACKGROUND OF THE INVENTION

The invention relates to an auxiliary-voltage source for supplying electric circuits which are at a high potential, and more particularly control, measuring and regulating circuits, for an electron gun which is supplied with a high voltage and comprises a cathode, heatable through a heater circuit, for the generation of an electron beam and is provided with a power supply which is located in the heater circuit and has an alternating-current section, and whose output current is adjustable.

Auxiliary-voltage sources are known to be used for the stated purpose. Auxiliary-voltage sources serve to supply the anode of a regulator tube, for example, or as heater-current supply for that tube, or generally to supply the electronic components of that tube or of the means for determining the actual value of the beam current, etc.

From German Pat. No. 15 65 145, an electron gun with several regulating circuits provided with auxiliary- or reference-voltage sources is known. However, these auxiliary-voltage sources are practically at ground potential, and there is no auxiliary-voltage source that is at a high potential. This prior-art electron gun has no electric circuits for control, measuring and regulating purposes which are at a high potential and therefore does not require the auxiliary voltage which otherwise would be necessary.

From German Pat. No. 24 60 424, an electron gun is known with regulating and control elements that are at a high potential. The patent makes no mention of an auxiliary-voltage supply for these regulating and control elements. In a practical embodiment of the prior-art regulating arrangement, the auxiliary-voltage sources consist of a mains-connected isolation transformer with a secondary winding that is followed by a further transformer having several secondary windings. The outputs of these secondary windings are applied to voltage regulators or connected to the heater circuit for the regulator tubes. This isolation transformer, which is designed for high potential differences of 150 kilovolts and up, for example, must be properly insulated, which makes it heavy, bulky and expensive. A further isolation transformer is required in every case to heat the cathode, and the prior-art arrangement therefore requires at least two isolation transformer. The term "isolation transformer" is applied to transformers which are designed to withstand potential differences of 10 kilovolts and up.

The use of regulating circuits and control elements which are at a high potential is desirable in that it makes it possible to achieve a control response having a particularly short time constant.

SUMMARY OF THE INVENTION

The object of the invention is to achieve a cost reduction by dispensing with an isolation transformer insulated for high potential differences without sacrificing the availability of at least one auxiliary voltage at a high potential.

In accordance with the invention, this object is accomplished, so far as the auxiliary-voltage source mentioned at the outset is concerned, in that there is disposed in the alternating-current section of the cathode heater circuit the primary winding of a current transformer with at least one secondary winding which is connected through a rectifier to a parallel regulator providing the auxiliary voltage.

The measure in accordance with the invention makes it possible to use the cathode heater circuit, which is already at a high potential, as a source for the auxiliary voltage without an actual isolation transformer being needed to supply the control, measuring and regulating circuits which are also at a high potential. An important factor is that the current flowing in the heater circuit is subject to fluctuations only within certain limits. In the case of electron guns for fusion and evaporation applications, the heater current is controlled specifically to regulate the emission current of the gun. In electron-beam welding guns, the power supply for the cathode heater circuit is usually regulated to provide a constant output current. In this particular case, the emission current is regulated through the control grid, which is likewise at a high voltage.

The parallel regulator, frequently called a shunt regulator, has the effect that a change in the output load has no reactive effect, or no appreciable reactive effect, on the source or on the input voltage. Since the input circuit is operated at constant current, this has the advantage of suppressing the load-dependent variation of the beam power which would otherwise occur due to a fluctuating cathode heater current. Any variation of the beam parameters, such as voltage or current, would ultimately require a change in the operating procedure in which the electron beam is employed. Guns used in electron-beam welding are particularly sensitive to variations in the beam parameters since such variations may have an adverse effect on the quality of the weld.

In the simplest case, the parallel regulator may consist of a zener diode if minor reactive effects on the source can be tolerated.

The auxiliary voltages under discussion here are in the low-voltage range of 15 or 24 volts, for example. In accordance with the invention, it may be particularly advantageous to provide the current transformer with a second secondary winding which has several times more turns and is connected through a further rectifier and a further parallel regulator to the control element for the control-grid voltage. The larger number of turns permits higher auxiliary voltages to be generated as needed, which may range from 0.5 to 2.0 kilovolts, for example. Such voltages can readily be used for the reactive regulation required with electron-beam welding guns, for example, for regulation of the control-grid voltage, and hence of the emission current.

Further advantageous characteristics of the invention are described in the dependent claims.

BRIEF DESCRIPTION OF THE DRAWINGS

Embodiments of the invention will now be described in greater detail with reference to drawings, which illustrate its use with an electron-beam welding gun and in which.

DETAILED DESCRIPTION OF THE INVENTION

Figure 1:
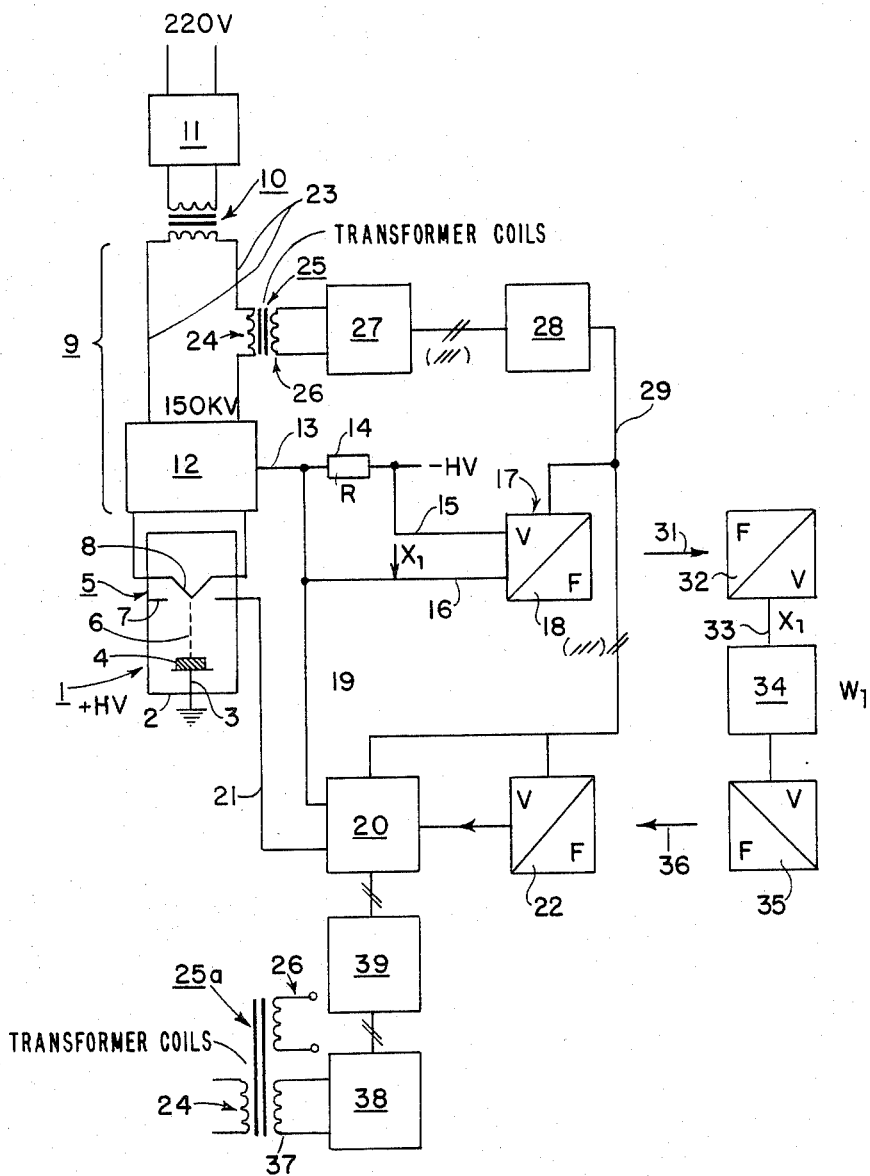
FIG. 1 is a schematic of one embodiment.

Shown merely diagrammatically in FIG. 1 is an electron-beam welder 1. It comprises a vacuum chamber 2 with a workpiece support 3 and a workpiece 4 as a target for an electron beam 6 emitted by an electron gun 5. Like the vacuum chamber 2, the workpiece 4 is at ground potential and forms the anode, as it were, for the electron beam 6.

The electron gun 5 comprises a control grid 7 and a cathode 8 heated directly by the passage of current. The cathode 8 is at a high negative potential of 150 kilovolts, and the control grid can be set for an even higher negative potential permitting the beam power to be varied accordingly.

The cathode 8 comprises a heater circuit 9 which is supplied by a conventional isolation transformer 10 preceded by a heater-current regulator 11. Included in the heater circuit 9 is a balanced-to-unbalanced transformer, or balun, 12, which comprises means for the rectification and smoothing of the heater current. The design of such baluns is prior art and therefore need not be discussed further.

The balun 12 has an output 13 for determination of the actual value of the beam current which can be taken off a precision resistor 14. The measured value $x_1$ is fed through lines 15 and 16 to a measured-value determining circuit 17 which includes a voltage-frequency converter 18.

The output 13 is connected through a further line 19 to a control element 20 for the control-grid voltage, said element in turn being connected to the control grid 7. The control element 20 is preceded by a frequency-voltage converter 22. Its function will be described in detail further on.

The heater circuit 9 comprises an alternating-current section 23, which is the portion of the circuit that is located ahead of the rectifier which is a component of the balun 12. It should be noted that electron guns for fusion and evaporation applications usually do not include such a rectifier, with the alternating-current section 23 then forming the entire heater circuit 9.

Located in the alternating-current section 23 is the primary winding 24 of a current transformer 25 with a secondary winding 26 connected to a rectifier 27. The latter, which for fusion purposes may also be provided with a ripple filter or the like, is connected to a parallel or shunt regulator 28, which in the simplest case may consist of a zener diode. The output 29 of the parallel regulator 28 is connected in parallel with the voltage-frequency converter 18, the frequency-voltage converter 22 and the control element 20 for the control-grid voltage. The auxiliary voltage generated in this manner is the supply voltage for said subsequent components.

The voltage-frequency converter 18 has a potential-free, i. e., nonelectric, output, which will not be described in detail, but which serves as the input of a potential-isolating transmission path which, together with its effective direction, is symbolized by an arrow 31. Such a transmission path may take the form of an optical fiber or may be formed of optical or acoustic transmitters and receivers. Light (infrared) radiation or ultrasonics may be used as the transmitting energy form. Disposed at the end of the transmission path 31 is a frequency-voltage converter 32 with an electrical output 33 that is connected to a beam-current regulator 34. In the latter, the signal present at the output 33 is compared with a desired voltage value $w_1$, and the control signal thus formed is applied to a voltage-frequency converter 35, from where it is fed over a potential-isolating transmission path 36 to the frequency-voltage The converters 32 and 35 and the beam-current regulator 34 are at ground potential. They are supplied by converter 22. The transmission path 36, for example an optical fiber as described above for similarly-identified potential-isolating transmission path 31 and its effective direction are also symbolized by an arrow.

further auxiliary-voltage sources of the conventional type, which for the sake of simplicity are not shown. In the voltage-frequency converters 18 and 35, the incoming electrical signals (voltages) are converted to nonelectrical signals whose frequency, amplitude, or modulation, etc., represent an image proportional to the voltage value. In the frequency-voltage converters 32 and 22, the reverse conversion to voltage signals takes place. The transmission paths 31 and 36 bridge the potential difference relative to the high potential.

It thus becomes possible to process the beam-current value picked up at the output 13 or at the precision resistor 14 still on the high-voltage side and to use it either there or at the end of the transmission path 31 at ground potential for a purpose such as indication of the measured value or conversion to a correcting value by means of the beam-current regulator 34. The cathode voltage can also be taken off and indicated in the manner shown.

Shown in the lower part of FIG. 1 is a current transformer 25a that may be substituted for the current transformer 25. Unlike the latter, the current transformer 25a has, in addition to the primary winding 24 and the first secondary winding 26, a second secondary winding 37 which is connected to a further rectifier 38 and to a further voltage-stabilized parallel regulator 39. The second secondary winding 37 has a great many more turns permitting the wattless generation of a voltage of 1 kilovolt, for example, which is applied to the control element 20 for the control-grid voltage. In this way, there is impressed on the high cathode voltage already present a voltage which is negative relative to the cathode voltage, again by 1 kilovolt. Through variation of this voltage by means of the control element 20, the beam current can be regulated conventionally. It is apparent that the control-grid voltage can also be generated and regulated in this way at a high potential and, more particularly, through the auxiliary-voltage source consisting of the components 25, 27 and 28, which is also at a high potential.

Figure 2:
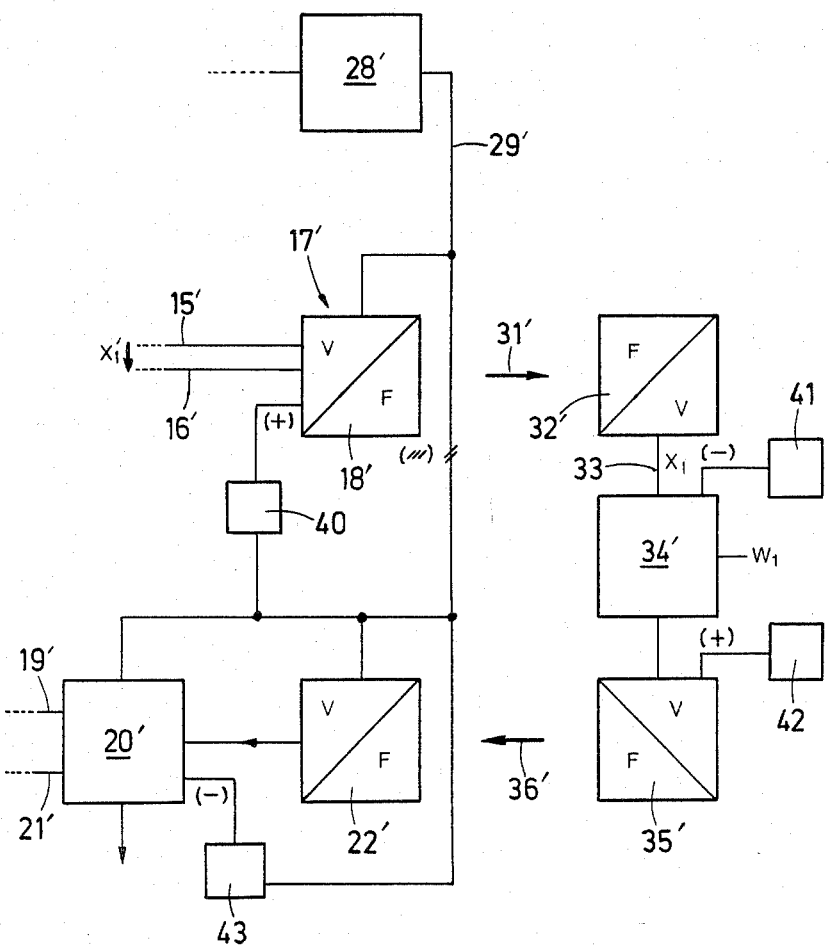
FIG. 2 is a partial schematic of another embodiment.

The portion of the embodiment shown in FIG. 2 is similar to that from FIG. 1 with the following further circuit features: Applied to the input of the voltage-frequency converter 18' is, in addition to the output of the parallel regulator 28' and to the measured value $x_1'$ (lines 15' and 16'), a direct-current source 40 which supplies a preselectable direct-current potential. Moreover, there is applied to the input of the beam-current regulator 34', in addition to the measured value $x_1'$, a further direct-current source 41 which supplies a corresponding direct-current potential of opposite sign with respect to the direct-current source 40. Of course, the signs may also be affected through appropriate circuitry within the converter and regulator.

Through the measures mentioned, signal increment occurs on the primary side of the transmission path 31', and a corresponding signal decrement on the secondary side, which has the following advantages:

Ahead of the transmission path 31', the existing voltage U is converted to a proportionate frequency F. With a low voltage, the available frequency will similarly be low. In the transmission of rapidly varying direct-current voltages, that is to say, of fast-rise signals, there is then the problem, up to a frequency of about 1 kilohertz, of a high residual ripple in the transmission frequency after the reconversion in the frequency-voltage converter. For regulating purposes, a highly uniform, or "smooth", direct-current voltage must be transmitted.

Through the circuit features according to FIG. 2, a direct-current voltage is added to the voltage signal on the primary side of the transmission path 31'. For example, if the voltage signal fluctuates between 0 and +5 volts, the transmitted frequency range will be from 0 to 100 kilohertz. Now, if a direct-current voltage of +5 volts corresponding to a frequency of 100 kilohertz is added to the voltage signal, the voltage to be transmitted will range from +5 to +10 volts, and the frequency to be transmitted, from 100 to 200 kilohertz. The added direct-current voltage of +5 volts is then subtracted on the secondary side to give the desired voltage signal. An effective signal ranging from 0 to +5 volts is then again available for regulating purposes.

Figure 3:
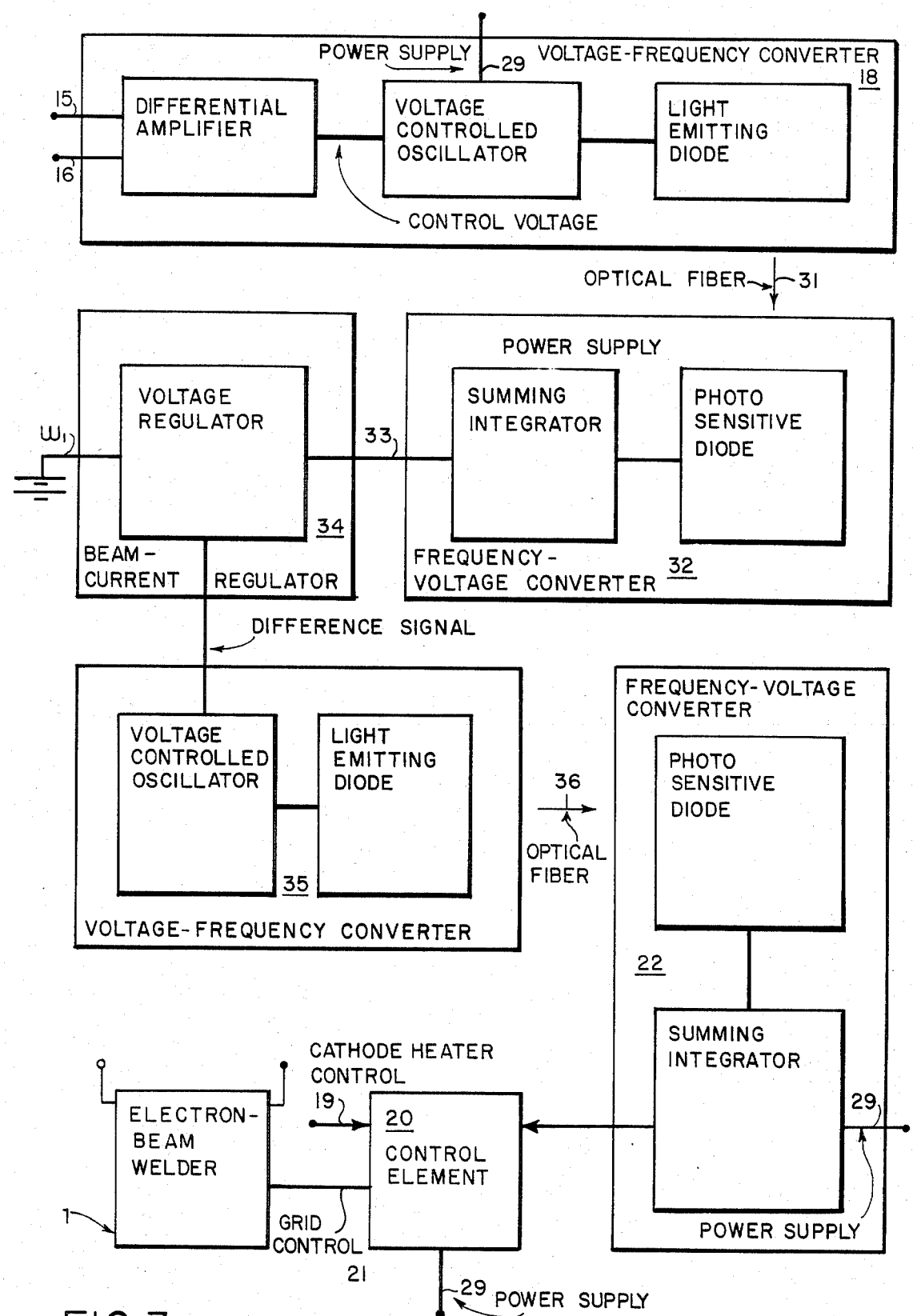
FIG. 3 is a more-detailed schematic of a portion of the embodiment shown in FIG. 1.

Moreover, a direct-current source 42 which likewise supplies a preselectable direct-current potential is connected, in addition to the output signal of the beam-current regulator, to the voltage-frequency converter 35' which follows the beam-current regulator 34'. Here, too, frequency decrement occurs in the transmission path 36'. To the control element 20' which follows the frequency-voltage converter 22', there is again connected, in addition to its output signal, a direct-current source 43 which supplies a corresponding direct-current potential of opposite sign. In this way, the problems attending the transmission of low frequencies are eliminated, and the embodiment according to FIG. 2 therefore is also applicable to and highly advantageous in the transmission of low voltages. FIG. 3 shows a more complete block diagram of the electro-optical control system along with the voltage-frequency conversion system for regulation.

It will be appreciated that the instant specification and claims are set forth by way of illustration and not of limitation, and that various changes and modifications may be made without departing from the spirit and scope of the present invention.

What is claimed is:

1. An auxiliary-voltage DC source for an electric circuit having AC and DC sections, comprising:
   a current transformer (25, 25a) which has a primary winding (24) in the AC section and at least a first secondary winding (26);
   a rectifier (27) connected across the first secondary winding (26) and having an output for the rectified potential therefrom; and
   a parallel regulator (28) connected to the output of the rectifier (27) and having an output (29) for providing the auxiliary-voltage DC source to the electric circuit.

2. In an auxiliary-voltage DC source for at least one of control, measuring and regulating electric circuits of an electron gun, the electron gun also having an AC circuit section for power supply, a cathode, and a cathode heater circuit connected to the cathode and powered from the AC circuit section, the control circuit or element having a DC circuit section connected to the AC circuit section for responsively controlling an electron beam from the cathode in the electron gun, the improvement comprising:
   a current transformer (25, 25a) in the AC section and having at least a first secondary winding (26);
   a rectifier (27) connected across the first secondary winding (26) and having an output for the rectified potential therefrom; and
   a parallel regulator (28) connected to the output of the rectifier (27) and having an output (29) for providing the auxiliary-voltage DC source to the electric circuit.

3. An auxiliary-voltage DC source according to claim 2, wherein the measuring circuit (17) provides a signal indicating the actual value of the electron beam current and the output of the parallel regulator (28) is connected as a supply voltage to the measuring circuit.

4. An auxiliary-voltage DC source according to claim 3, wherein the output (29) of the parallel regulator (28) is connected as a supply voltage to the DC current section of the control circuit (20).

5. An auxiliary-voltage DC source according to claim 4, and additionally comprising a second secondary winding (37) in the current transformer (25a) having several times more turns than the first secondary winding, a further rectifier (38) connected across the second secondary winding and having an output for the rectified potential therefrom, and a further parallel regulator (39) connecting the output of the further rectifier (38) to the DC circuit section of the control circuit (20) for further controlling the electron beam.

6. An auxiliary-voltage DC source according to claim 3, and further comprising:
   a beam-current regulator means (32, 34, 35) responsive to the signal provided by the measuring circuit (17) for providing a beam-current control signal;
   means (22) applying the beam current control signal to the DC circuit section of the control circuit for additionally controlling the electron beam from the cathode in the electron gun; and
   means (18, 35) in at least one of the measuring circuit (17) and beam-current regulation means (32, 34, 35) for providing the signal provided thereby as a non-electric signal.

7. An auxiliary-voltage DC source according to claim 6, and additionally comprising a second secondary winding (37) in the current transformer (25a) having several times more turns than the first secondary winding, a further rectifier (38) connected across the second secondary winding and having an output for the rectified potential therefrom, and a further parallel regulator (39) connecting the output of the further rectifier (38) to the DC circuit section of the control circuit (20) for further controlling the electron beam.

8. An auxiliary-voltage DC source according to claim 7, and further comprising means (40) for applying a pre-selectable signal to the signal provided by the measuring circuit (17), and means (41) for applying a signal of corresponding value but opposite sign to the beam current control signal provided by the beam-current regulator means (34).

9. An auxiliary-voltage DC source according to claim 6, and further comprising means (40) for applying a pre-selectable signal to the signal provided by the measuring circuit (17), and means (41) for applying a signal of corresponding value but opposite sign to the beam current control signal provided by the beam-current regulator means (34).

10. An auxiliary voltage DC source according to claim 6, characterized in that the beam-current regulator (34) is followed by a voltage-frequency converter (35) to which a pre-selectable direct-current potential is further applied by means of a direct-current source (42), and that a corresponding direct-current potential of opposite sign is further applied to the input of the control element (20) by means of a further direct-current source (43).

11. An auxiliary-voltage DC source according to claim 3, and additionally comprising a second secondary winding (37) in the current transformer (25a) having several times more turns than the first secondary winding, a further rectifier (38) connected across the second secondary winding and having an output for the rectified potential therefrom, and a further parallel regulator (39) connecting the output of the further rectifier (38) to the DC circuit section of the control circuit (20) for further controlling the electron beam.

12. An auxiliary-voltage DC source according to claim 2, wherein the output (29) of the parallel regulator (28) is connected as a supply voltage to the DC current section of the control circuit (20).

13. An auxiliary-voltage DC source according to claim 12, and additionally comprising a second secondary winding (37) in the current transformer (25a) having several times more turns than the first secondary winding, a further rectifier (38) connected across the second secondary winding and having an output for the rectified potential therefrom, and a further parallel regulator (39) connecting the output of the further rectifier (38) to the DC circuit section of the control circuit (20) for further controlling the electron beam.

14. An auxiliary-voltage DC source according to claim 2, and additionally comprising a second secondary winding (37) in the current transformer (25a) having several times more turns than the first secondary winding, a further rectifier (38) connected across the second secondary winding and having an output for the rectified potential therefrom, and a further parallel regulator (39) connecting the output of the further rectifier (38) to the DC circuit section of the control circuit (20) for further controlling the electron beam.

* * * * *